(12) United States Patent
Lee et al.

(10) Patent No.: US 7,342,526 B2
(45) Date of Patent: Mar. 11, 2008

(54) DIGITAL-TO-ANALOG CONVERTER USING PLURAL TRANSISTORS HAVING THE SAME OPERATING CHARACTERISTICS

(75) Inventors: Jung-eun Lee, Seongnam-si (KR); Han-seung Lee, Ansan-si (KR); Hoon-tae Kim, Yongin-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 11/347,218

(22) Filed: Feb. 6, 2006

(65) Prior Publication Data

US 2006/0176202 A1    Aug. 10, 2006

(30) Foreign Application Priority Data

Feb. 4, 2005    (KR) ............... 10-2005-0010770

(51) Int. Cl.
*H03M 1/66* (2006.01)
(52) U.S. Cl. .................. 341/144; 341/150
(58) Field of Classification Search .......... 341/144, 341/135, 136, 150, 133
See application file for complete search history.

(56) References Cited

U.S. PATENT DOCUMENTS

| | | | | |
|---|---|---|---|---|
| 5,155,385 A * | 10/1992 | Gotoh et al. | ........... | 327/562 |
| 5,189,312 A * | 2/1993 | Shimizu et al. | ........... | 327/64 |
| 5,689,258 A * | 11/1997 | Nakamura et al. | ........... | 341/136 |
| 5,696,509 A * | 12/1997 | Maejima | ........... | 341/150 |
| 5,831,566 A * | 11/1998 | Ginetti | ........... | 341/144 |
| 5,898,342 A * | 4/1999 | Bell | ........... | 330/297 |
| 5,903,234 A * | 5/1999 | Kimura | ........... | 341/144 |
| 6,067,037 A * | 5/2000 | Kato | ........... | 341/150 |
| 6,198,418 B1 * | 3/2001 | Ishizuka | ........... | 341/144 |
| 6,664,814 B1 * | 12/2003 | Evans et al. | ........... | 327/65 |
| 6,686,859 B2 * | 2/2004 | Aiura et al. | ........... | 341/144 |
| 6,917,319 B1 * | 7/2005 | Abadeer et al. | ........... | 341/133 |
| 7,026,971 B2 * | 4/2006 | Horsky et al. | ........... | 341/145 |
| 7,126,518 B2 * | 10/2006 | Tsuchi | ........... | 341/144 |

* cited by examiner

*Primary Examiner*—Peguy JeanPierre
(74) *Attorney, Agent, or Firm*—Sughrue Mion, PLLC

(57) ABSTRACT

A digital-to-analog converter converts a digital input signal into an analog signal. The digital-to-analog converter includes: a power-supply unit for outputting voltages of different magnitudes through plural output terminals thereof; plural switches connected to the plural output terminals, which are controlled on and off, and are for applying the output voltages of the power-supply unit or a ground voltage to a next stage; and plural source transistors connected to the plural switches for outputting currents of magnitudes corresponding to the voltages applied from the respective connected switches of the plural switches. The plural source transistors are designed to have the same operating characteristics, thereby improving glitch characteristics.

19 Claims, 7 Drawing Sheets

DIGITAL-TO-ANALOG CONVERTER USING PLURAL TRANSISTORS HAVING THE SAME OPERATING CHARACTERISTICS

CROSS-REFERENCE TO RELATED APPLICATIONS

This application claims benefit under 35 U.S.C. § 119 from Korean Patent Application 10-2005-0010770 filed on Feb. 4, 2005 in the Korean Intellectual Property Office, the entire contents of which are incorporated herein by reference.

BACKGROUND OF THE INVENTION

1. Field of the Invention

The present invention relates to a digital-to-analog converter converting a digital signal into an analog signal, and more particularly to a digitalto-analog converter for digital-to-analog conversions by applying different gate voltages to plural metal oxide semiconductor (MOS) transistors having the same operating characteristics.

2. Description of the Related Art

The digital-to-analog converter is a device for converting a digital signal into an analog signal. The digital-to-analog converter is used in diverse electronic chips. Equation 1, below, defines electric currents output from the digital-to-analog converter.

$$I_o = I_{ref} * (b_0 * 2^0 + b_1 * 2^1 + b_2 * 2^2 + b_3 * b^3 + \ldots + b_{n-1} * 2^{n-1})$$

In Equation 1, above, $I_o$ denotes an output current of a digital-to-analog converter, $b_n$ denotes a bit value of 0 or 1, and $I_{ref}$ denotes a reference level. In detail and for example, if a digital signal of 1100 has been input, an output current, $I_o$, of the digital-to-analog converter can be calculated as $I_{ref}(0*1+0*1+1*4+1*8)=12*I_{ref}$.

In order to output such current as calculated using Equation 1, the digital-to-analog converter uses plural current sources each supplying current of $2^n$, respectively. A current source can use an MOS transistor biased by a predetermined bias signal. Further, the current output from the MOS transistor can be expressed in Equation 2 as below.

$$I = \frac{\mu * C}{2} * \frac{W}{L} * (V_{gs} - V_t)^2 \quad \text{[Equation 2]}$$

In Equation 2, $\mu$ denotes electron mobility in an MOS channel, C denotes capacitance per unit area of a parallel plate capacitor formed by a gate electrode and the channel, W denotes width of the gate electrode, L denotes length of the gate electrode, $V_{gs}$ denotes a potential difference between the gate and the source, and $V_t$ denotes a threshold voltage. In view of Equation 2, the magnitude of an output current can be changed depending on the width and length of the gate electrode and depending on a gate-source voltage.

FIG. 1 is a circuit diagram for showing a structure of a digital-to-analog converter disclosed in U.S. Pat. No. 6,577, 260. In FIG. 1, the conventional digital-to-analog converter has a current source 10, a switch unit 20, and a clock feed-through removal switch 30.

The current source 10 is configured with plural current mirror circuits. Gates of TC and TC0 are connected to each other, so current I is output from the gate TC0, which has the same magnitude as current flowing in the gate TC. Further, different designs are applied to the width and lengths of the gate electrodes TC1 to TCn connected to the gate of TC0 in the same structure, which enables electric current output from a transistor to have the form of $2^n * I$ in magnitude. Current output from the current source 10 results in I, 2I, 4I, 8I, ... $2^n$I in magnitude.

The switch unit 20 has plural first switches TS0 to TSn connected to the transistors of the current source 10. The first switches TS0 to TSn are turned on or off depending on digital input signals D0 to Dn. A digital input signal can be a low-level pulse or a high-level pulse corresponding to an input binary code of 0 or 1. The high-level pulse causes the first switches to be turned on. Thus, the first switches turned on cause currents to flow from the transistors of the current source 10 to a next stage.

The clock feed-through removal switch 30 has plural second switches DT0 to DTn connected to the first switches TS0 to TSn of the switch unit 20. The MOS transistors are used as the first switches TS0 to TSn of the switch unit 20, and the first switches TS0 to TSn perform switching operations according to a certain input clock, which causes the feed-through due to electric charges accumulated in transistor channels. Such a feed-through caused by the accumulated charges can be eliminated with digital-inverting input signals applied to the second switches DT0 to DTn.

FIG. 2 is a view for describing drawbacks to the digital-to-analog converter of FIG. 1. In FIG. 2, a digital input signal is changed from "0111" to "1000", further description of which will be made below. In Equation 1, analog current corresponding to "0111" is $7I_{ref}$ in magnitude, and analog current corresponding to "1000" is $8I_{ref}$ in magnitude.

The MOS transistors for the first switches TS0 to TSn have the same operating characteristics as the transistors TC0 to TCn in order to pass the currents output from the transistors TC0 to TCn of the current source 10 to a next stage. Thus, as a switch passes relatively large current, the load on the switch increases in proportion to the current, and the switch speed of the switch decreases in proportion to the current. Accordingly, as shown in FIG. 2, the switching speed changes in the order of D0, D1, D2, and D3, so that the switches D0 to D3 are turned on at times t1 to t4, respectively, as the digital input signal changes from "0111" to "1000". Output current $I_o$ is identical to a sum of currents output from the switches, so that output current $I_o$ has a magnitude corresponding to 0110 in a time interval from t1 to t2, 0100 in a time interval from t2 to t3, and 0000 in a time interval from t3 to t4, but the output current $I_o$ reaches a magnitude corresponding to 1000 after the time point t4, which causes a problem of poor glitch characteristics since errors occur for the time interval from t1 to t4.

FIG. 3 is a circuit diagram for showing in brief a re-structured digital-to-analog converter disclosed in U.S. Pat. No. 5,969,658. The digital-to-analog converter in FIG. 3 is built with plural resistors connected. That is, plural first resistors each having the same resistance of R is arranged in series, and resistors each having resistance of 2R are connected to their connection nodes, respectively. Thus, a voltage $V_{ref}$ applied to one end of the first resistors is distributed across the first and second resistors. As a result, current such as I, (½)I, (¼)I, and (⅛)I can be output through the plural second resistors, respectively. Referring to FIG. 3, if switches (not shown) connected to the second resistors are controlled on and off according to a digital input signal, the digital-to-analog converter can output analog currents having a predetermined magnitude corresponding to the digital input signal.

However, if the switches are turned on, the switches each have turn-on resistance of a certain magnitude, which results in a problems of accurate digital-to-analog-converting operations since it is difficult to maintain a resistance ratio adjusted upon designs of the digital-to-analog converter.

SUMMARY OF THE INVENTION

The present invention has been developed in order to solve the above drawbacks and other problems associated with the conventional arrangement. An aspect of the present invention is to provide a digital-to-analog converter capable of reducing a converting time period and improving glitch characteristics by using plural transistors having the same operating characteristics so as to perform digital-to-analog converting operations.

According to an aspect of the present invention, there is provided a digital-to-analog converter, comprising a power-supply unit for outputting voltages of different magnitudes through plural output terminals thereof; plural switches connected to the plural output terminals, which are controlled on and off, and which apply the output voltages of the power-supply unit or a ground voltage to a next stage; and plural source transistors connected to the plural switches, for outputting currents of magnitudes corresponding to the voltages applied from the connected switches.

According to an exemplary embodiment, the plural source transistors have the same operating characteristics.

In this exemplary embodiment, the plural source transistors have the same electron mobility in an MOS-channel, capacitance per unit area of a gate electrode, width of the gate electrode, length of the gate electrode, and threshold voltage. The plural source transistors output current of a magnitude of $2^n$, respectively.

Still further, the power-supply unit has a current source for outputting reference current of a certain magnitude; plural current-mirror circuits arranged in order from the current source for converting, as an output, the reference current into current of a certain magnitude proportional to the arrangement order from the current source; and plural transistors connected to the plural current-mirror circuits for outputting voltages of certain magnitudes corresponding to currents output from the connected current-mirror circuits.

In this exemplary embodiment the plural current-mirror circuits convert mirrored reference current to current expressed in an equation as below:

$$I=2^{n-1}*\alpha*I_{ref},$$

in here, $I_{ref}$ denotes the reference current, n denotes a natural number, and $\alpha$ denotes a constant.

In another exemplary embodiment, the plural source transistors are MOS transistors, wherein output voltages from the plural switches are applied to the gate electrodes of the MOS transistors.

In another exemplary embodiment, the digital-to-analog converter further comprises an output unit for outputting current of a magnitude corresponding to a sum of currents output from the plural source transistors.

Further, the plural switches input, are controlled via a the external input signal, a low-level pulse or a high-level pulse corresponding to an input digital signal of 0 or 1, respectively.

In another exemplary embodiment, the plural switches each have a first transistor set having first nMOS and pMOS transistors connected to face each other, and, if the first nMOS and pMOS transistors are turned on, pass an output voltage of the power-supply unit to a next stage; and a second transistor set having second nMOS and pMOS transistors connected to face each other, and, if the second nMOS and pMOS transistors are turned on, pass the ground voltage to the next stage.

BRIEF DESCRIPTION OF THE DRAWINGS

The above and/or other aspects of the present invention will be more apparent by describing exemplary embodiments of the present invention with reference to the accompanying drawings, in which.

DETAILED DESCRIPTION OF EXEMPLARY EMBODIMENTS

Hereinafter, exemplary embodiments of the present invention will be described in detail with reference to the accompanying drawings.

Figure 1:
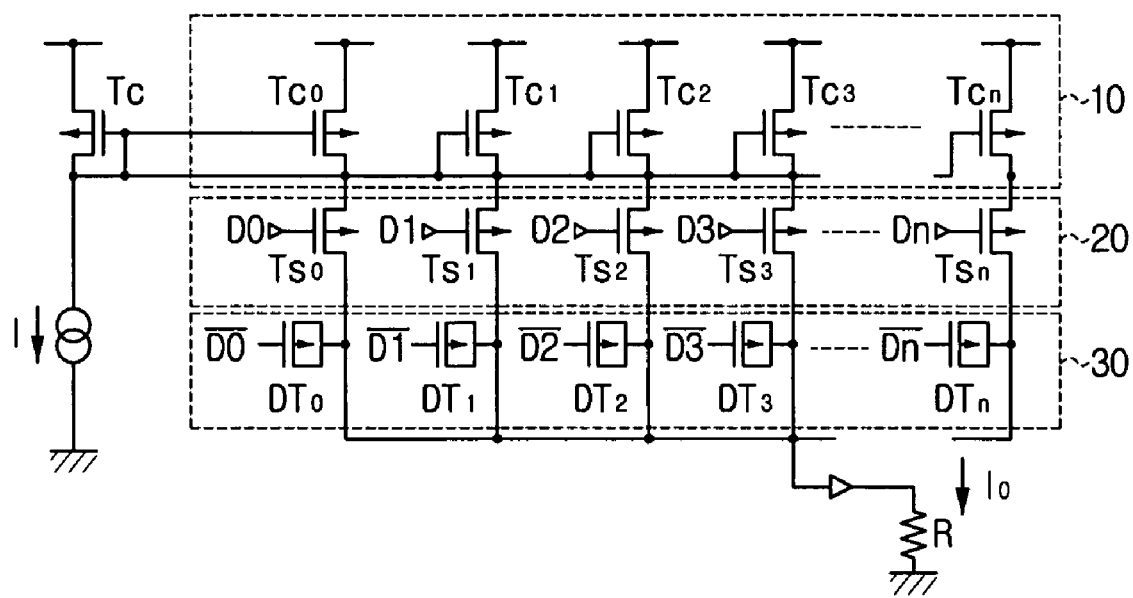
FIG. 1 is a circuit diagram for showing a structure of a conventional digital-to-analog converter.
Figure 2:
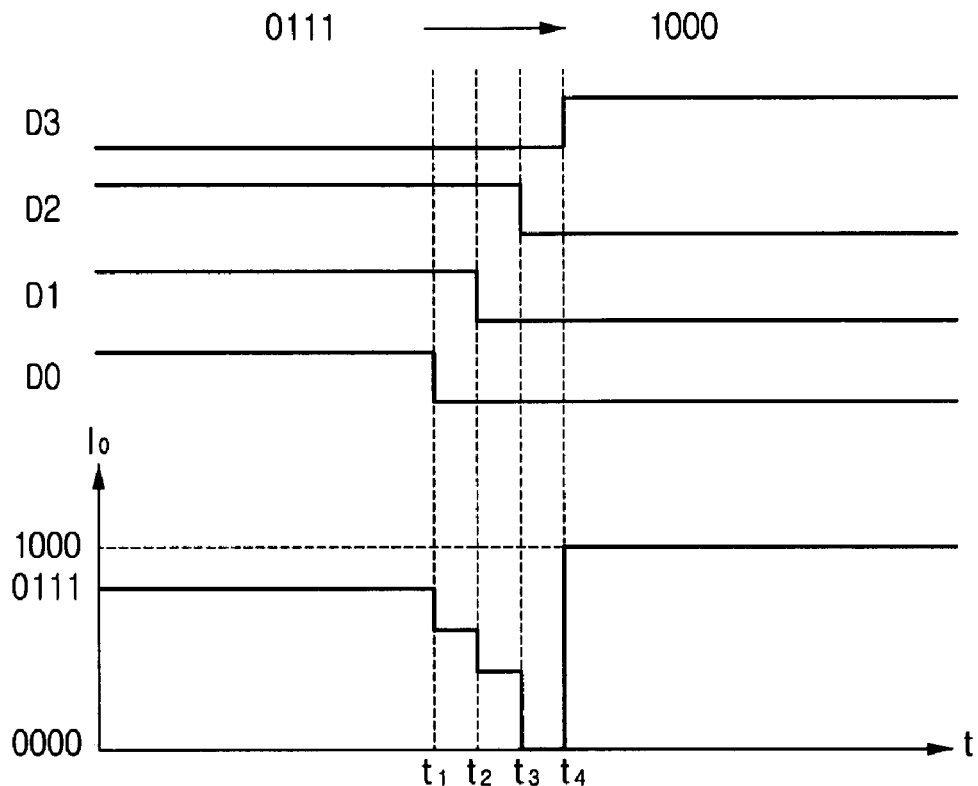
FIG. 2 is a view for describing switching delays of the digital-to-analog converter of FIG. 1.
Figure 3:
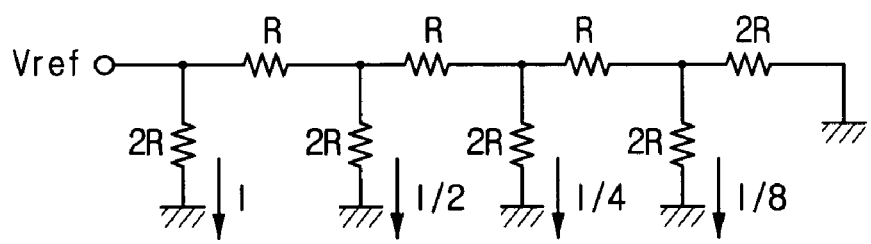
FIG. 3 is a circuit diagram for showing a structure of another conventional digital-to-analog converter.
Figure 4:
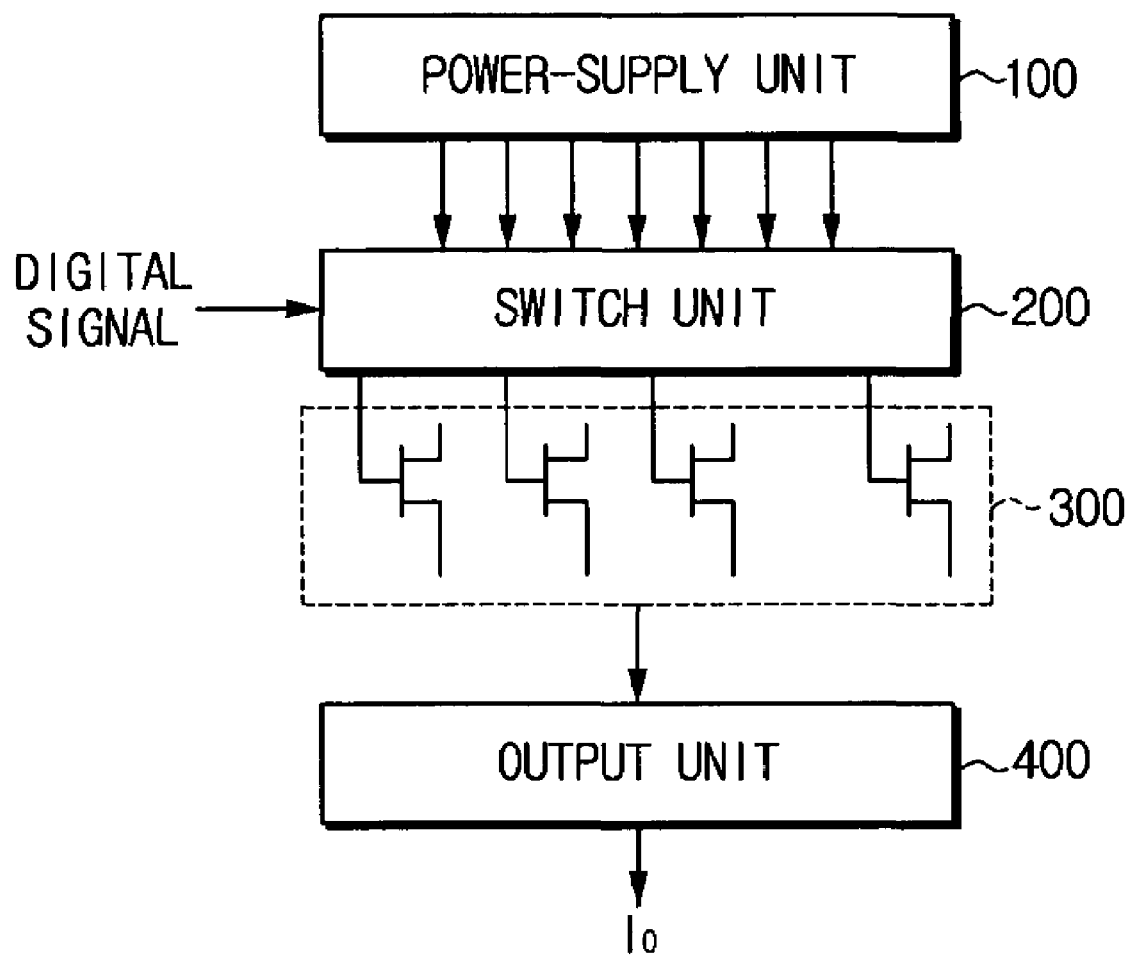
FIG. 4 is a block diagram for showing a structure of a digital-to-analog converter according to an exemplary embodiment of the present invention.

FIG. 4 is a block diagram for showing a structure of a digital-to-analog converter according to an exemplary embodiment of the present invention. In FIG. 4, the digital-to-analog converter has a power-supply unit 100, a switch unit 200, a current-generating unit 300, and an output unit 400.

The power-supply unit 100 outputs voltages of different magnitudes through plural output terminals. In here, the power-supply unit 100 is designed to proportionally increase the magnitudes of its output voltages in order of its output terminals.

The switch unit 200 includes plural switches connected to output terminals of the power-supply unit 100. The switches are controlled on and off according to an external input signal. In here, the external input signal can be either a low-level pulse or a high-level pulse corresponding to a digital input of 0 or 1. The switches are turned on with the high-level pulse input thereto, so as to apply voltages of the power-supply unit 100 to a next stage. However, the switches are turned off with the low-level pulse input thereto, so as to apply the ground voltage to the next stage.

The current-generating unit 300 includes plural transistors connected to the ends of the switches of the switch unit 200. Each transistor can be an MOS transistor. The MOS transistors are designed to have the same operating characteristics. That is, the MOS transistors each have at least the same electron mobility in the MOS channel, capacitance per unit area of the gate electrode, gate electrode width, gate electrode length, threshold voltage.

Further, the voltages output from the switches of the switch unit 200 are applied to the gate electrodes of the MOS transistors. If the first switch connected to the first MOS transistor is turned on, the output voltage of the power-supply unit 100 is applied to the gate electrode of the first MOS transistor, and the first MOS transistor outputs current of a certain magnitude. The magnitude of the output current can be calculated based on Equation 2, above. In here, if a switch connected to the second MOS transistor is turned on, the magnitude of output current varies from the output current of the first transistor since the second MOS transistor has the same operating characteristics as the first transistor, but has a different gate voltage from the first MOS transistor. Thus, the MOS transistors of the current-generating unit 300 output currents of different magnitudes. The magnitude of the total currents output from the current-generating unit 300 can be expressed in Equation 1 as above. In here, no switching delays occur since MOS transistors having the same operating characteristics are used, which results in improvements of glitch characteristics.

Further, the output unit 400 outputs current of a magnitude corresponding to a sum of the currents output from the MOS transistors of the current-generating unit 300. Thus, the output unit 400 can output current of a magnitude corresponding to a digital input signal.

Figure 5:
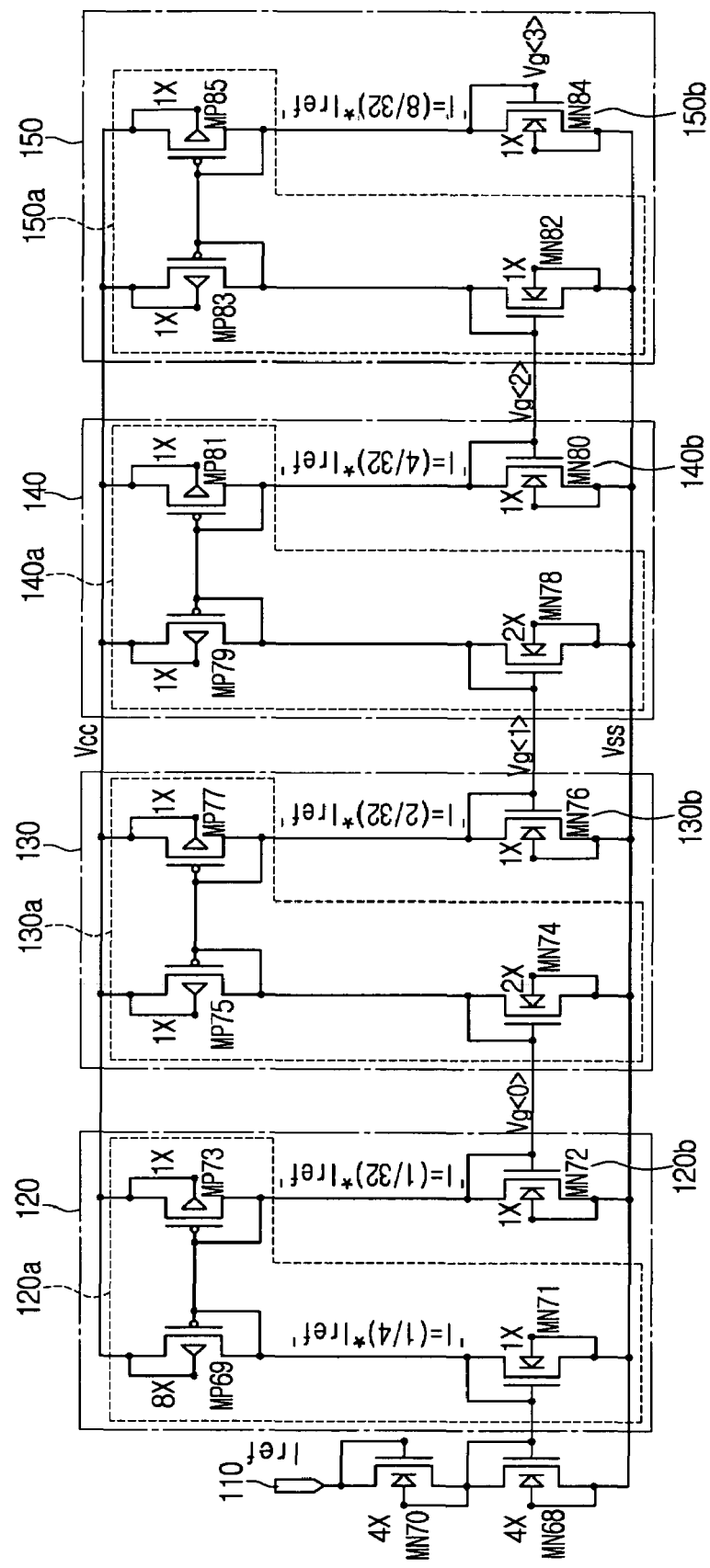
FIG. 5 is a circuit diagram for showing a structure of a power-supply unit for the digital-to-analog converter of FIG. 4.

FIG. 5 is a circuit diagram for showing a structure of the power-supply unit 100 of the digital-to-analog converter of FIG. 4. In FIG. 5, the power-supply unit 100 has a current source 110 and four power-supplying circuits 120, 130, 140, and 150. The power-supplying circuits 120 to 150 each have a current-mirror circuit 120a, 130a, 140a, or 150a and transistors 120b to 150b. FIG. 5 shows the four power-supplying circuits 120 to 150, but the number of the power-supplying circuits can vary depending on the number of bits of a digital signal to be converted.

The current source 110 supplies a reference current $I_{ref}$ of a certain magnitude. The $I_{ref}$ mirroring takes place among MOS transistors MN70, MN68, and MN71, and the $I_{ref}$ is input to the first power-supplying circuit 120. In here, the magnitude of the mirrored current becomes identical to $(\frac{1}{4})*I_{ref}$ since the operating characteristics of the MOS transistors MN70, MN68, and MN71 are 4×, 4×, and 1×, respectively. In here, 4× or 1× denotes an amplification power due to the difference of widths W and lengths L of gate electrodes. That is, if a width becomes twice as wide while the length remains the same, the amplification power turns into 2×, and, if the width becomes four times wider, the amplification power turns into 4×.

Meanwhile, transistors MP69, MN71, and MP73 of the first power-supplying circuit 120 form a current-mirror circuit, that is, the first current-mirror circuit 120a. The operating characteristics of the transistors MP69, MN71, and MP73 have a 8×, a 1×, and a 1× amplification powers, respectively, the magnitude of mirrored current in the first current-mirror circuit 120a becomes $(\frac{1}{32})*I_{ref}$. Hereinafter, the mirrored current of the first current-mirror circuit 120a is denoted as a reference I. The mirrored current I is applied to the first transistor 120b of the first power-supplying circuit 120. Thus, the first transistor MN72 outputs a gate voltage Vg<0> of a certain magnitude corresponding to the magnitude of the mirrored current I.

Further, transistors MN74, MN75, and MP77 of the second power-supplying circuit 130 form a current-mirror circuit (second current-mirror circuit 130a). The operating characteristics of the transistors MN74, MN75, and MP77 have a 2×, a 1×, and a 1× amplification power, respectively, the magnitude of mirrored current by the voltage-mirror circuit 130a becomes 2I. Thus, the second transistor 130b outputs a gate voltage Vg<1> of a certain magnitude corresponding to 2I.

Likewise, gate voltages Vg<2> and Vg<3> are output due to the third and fourth power-supplying circuits 140 and 150, respectively. In here, the operating characteristics of the transistors used in the third and fourth power-supplying circuits 140 and 150 are the same as those of the transistors of the second power-supplying circuit 130.

Accordingly, the current I output from the current-mirror circuit 120a, 130a, 140a, or 150a can be expressed in Equation 3, below.

$$I=2^{n-1}*\alpha*I_{ref} \quad \text{[Equation 3]}$$

In Equation 3, $I_{ref}$ denotes reference current, n denotes a natural number, and α denotes a predetermined constant. Variable α has a value of 1/32 in the circuit of FIG. 5. Variable n denotes an arrangement order of the current-mirror circuit 120a, 130a, 140a, or 150a from the current source 110. Thus, the current output from the current-mirror circuit 120a, 130a, 140a, or 150a has a magnitude of $2^n$, and the magnitude proportionally increases in order of arrangement from the current source 110. Further, the output voltages of the transistors 120b, 130b, 140b, and 150b to which the currents of the current-mirror circuits 120a, 130a, 140a, and 150a are input proportionally increase in order of the arrangement. That is, the magnitudes Vg<0>, Vg<1>, Vg<2>, and Vg<3> correspond to $2^0 I$, $2^1 I$, $2^2 I$, and $2^3 I$.

Figure 6:
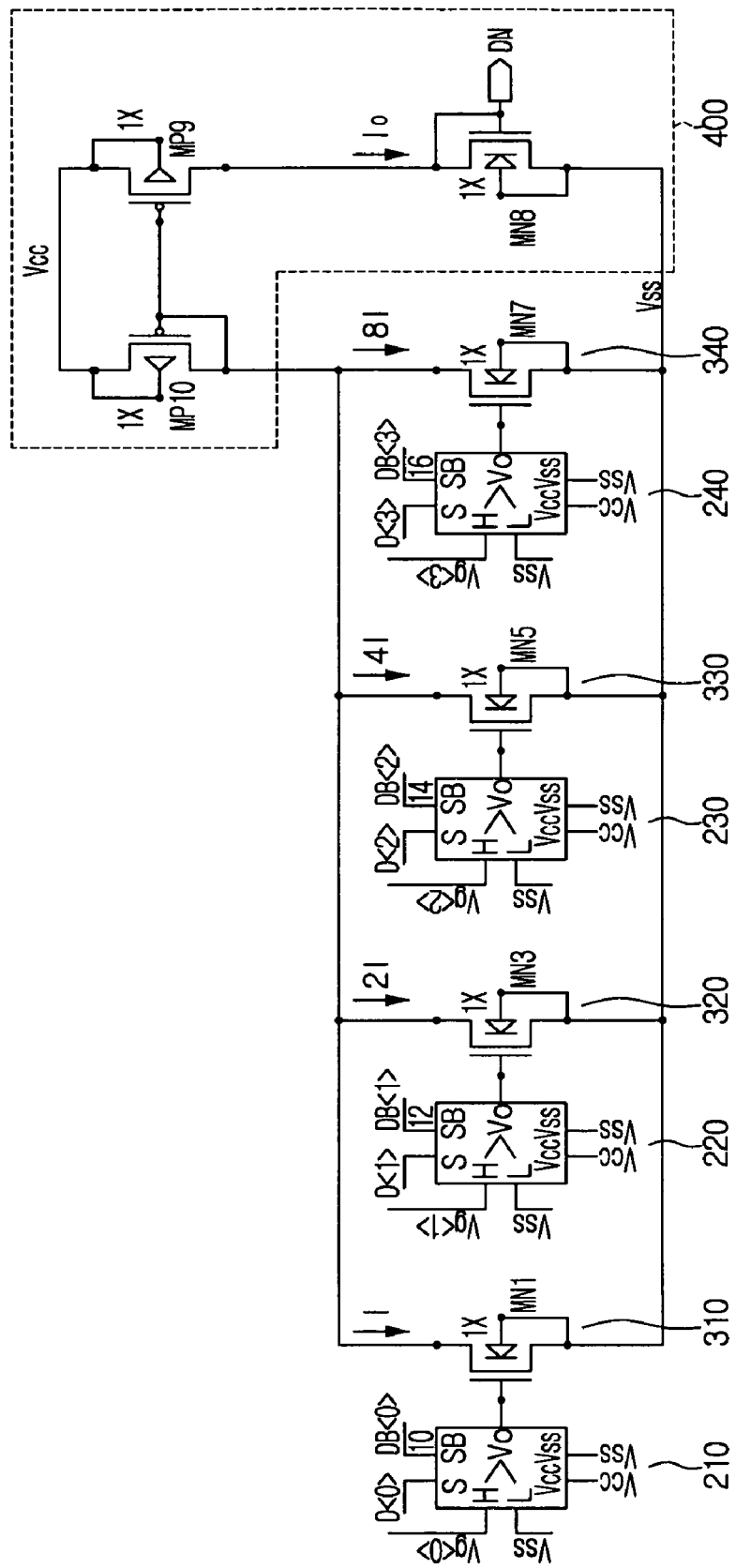
FIG. 6 is a circuit diagram for showing a current-generating unit and a output unit for the digital-to-analog converter of FIG. 4.

FIG. 6 is a circuit diagram for showing the structures of the current-generating unit 300 and output unit 400 which are used in the digital-to-analog converter of FIG. 4. In FIG. 6, the current-generating unit 300 has plural MOS transistors 310, 320, 330, and 340 (310 to 340). In FIG. 6, it is shown that the four MOS transistors 310 to 340 correspond to the number of the power-supplying circuits 120, 130, 140, and 150 (120 to 150) of FIG. 5.

The switches 210, 220, 230, and 240 (210 to 240) are connected to the gate electrodes of the MOS transistors 310 to 340. The switches 210 to 240 are controlled on and off according to external input signals D<0> to D<3> and external input inverting signals DB<0> to DB<3>. Therefore, the output voltage of the power-supply unit 100 or the ground voltage is applied to the MOS transistors 310 to 340.

In detail, if the first switch 310 is turned on, the gate voltage Vg<0> is applied to the gate of the first MOS transistor 310. Thus, the first MOS transistor 310 generates current I having a magnitude corresponding to the gate voltage Vg<0>. The current I can be calculated based on Equation 2, above. If the first switch 210 is turned off, the ground voltage of 0V is applied to the gate of the first MOS transistor 310, and the current I is not produced.

If the second switch 220 is turned on, the gate voltage Vg<1> is applied to the gate of the second MOS transistor 320. Accordingly, a current of 2I is produced corresponding to the gate voltage Vg<1>. Likewise, if the second switch 220 is turned off, the current of 2I is not produced. As above, if the third and fourth switches, 230 and 240, are turned on, then the third and fourth transistors can produce currents of 4I and 8I in magnitude, respectively.

The output unit 400 can be built with a current-mirror circuit having plural transistors MP10, MP9, and MN8. Thus, the output unit 400 can output mirrored current of a magnitude corresponding to a sum of entire currents produced by the first to fourth MOS transistors 310 to 340. The current from the output unit 400 can be expressed in Equation 4, below.

$$I_o = \alpha * I_{ref} * (b0*2^0 + b1*2^1 + b2*2^2 + b3*2^3 + \ldots + bn-1*2^{n-1})$$

In Equation 4, $I_o$ denotes analog output current corresponding to a digital input signal, $I_{ref}$ reference current, b0 to bn−1 denote digital input binary codes, and n denotes a natural number.

In Equation 4, if a digital signal of 1111 is input, the first to fourth switches 210 to 240 are all turned on, so output current has a magnitude of 15I. If a digital signal of 1100 is input, only the third and fourth switches 230 and 240 are turned on, so output current has a magnitude of 12I. Thus, an input digital signal can be converted into an analog signal.

All of the first to fourth MOS transistors 310 to 340 have the same operating characteristics. Therefore, the first to fourth switches 210 to 240 connected to the first to fourth MOS transistors 310 to 340 have the same operating characteristics. In order to achieve the same operating characteristics, transistors are used which have at least the same electron mobility in MOS-channels, capacitance per unit area of the gate electrode, width of the gate electrode, length of the gate electrode, threshold voltage.

Accordingly, the switching delays disappear since the switches 210 to 240 have the same switching load.

Figure 7:
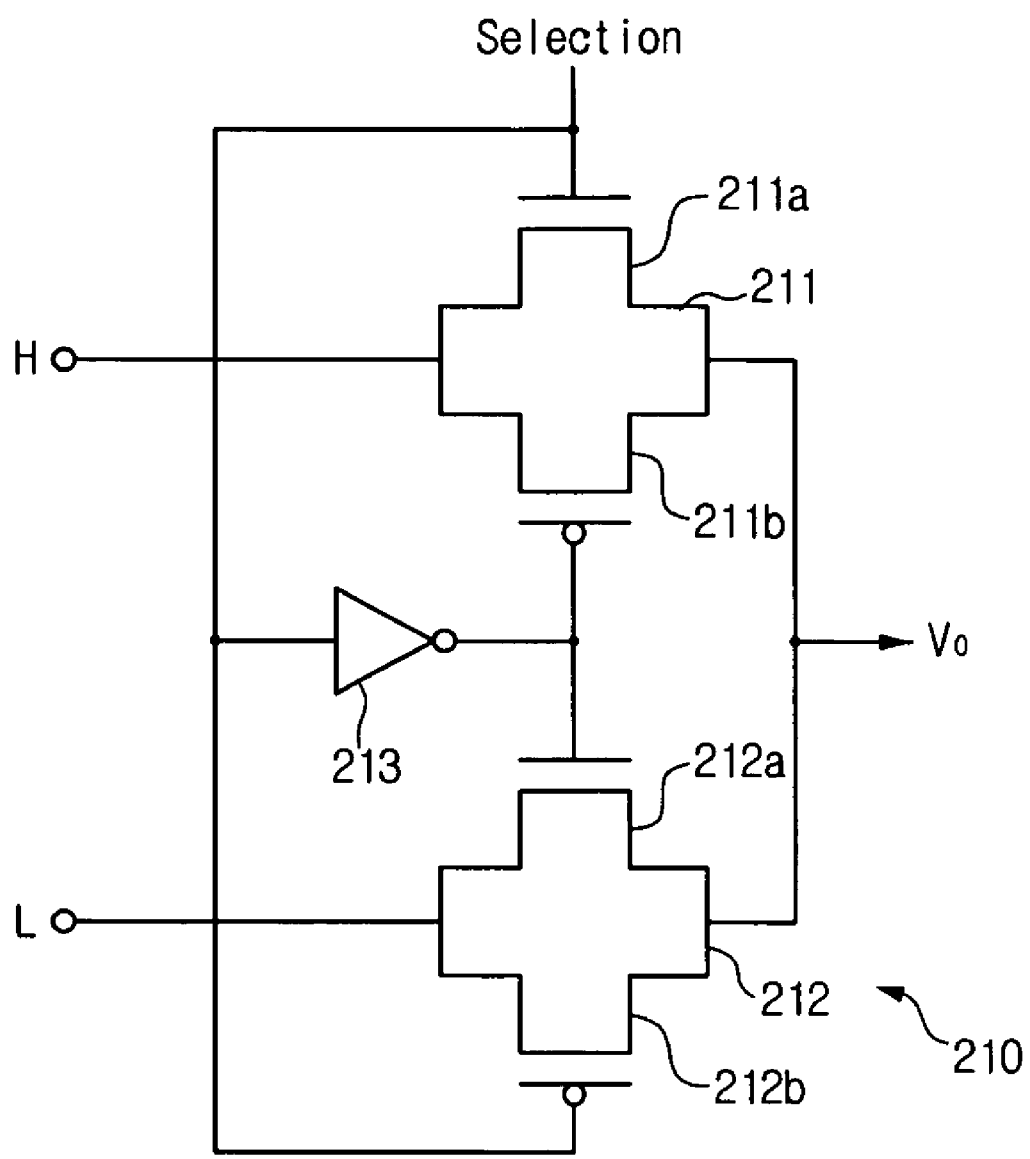
FIG. 7 is a circuit diagram for showing a structure of a switch for the digital-to-analog converter of FIG. 4.

FIG. 7 is a circuit diagram for showing a structure of one of the plural switches 210 to 240 used for the present digital-to-analog converter. In FIG. 7, the switch 210 has a first transistor set 211, a second transistor set 212, and an inverting circuit 213.

The first and second transistor sets 211 and 212 are formed with an nMOS transistor and a pMOS transistor facing each other. An external input signal, which is denoted as "Selection", is applied to a gate of the nMOS transistor 211a at the first transistor set 211. In here, the external input signal can be either a high pulse or a low pulse corresponding to a digital input of 1 or 0. Such a pulse signal is generated from a control unit (not shown) of a device to which the present digital-to-analog converter is applied, and wherein the pulse signal can be output to the switches.

Meanwhile, an inverted signal of the external input signal is applied to a gate of the pMOS transistor 211b at the first transistor set 211. To do this, the inverting circuit 213 is connected to the pMOS gate. In such circumstances, if a high-level pulse signal is applied, that is, if a digital signal of "1" is input, the nMOS and pMOS transistors 211a and 211b of the first transistor set 211 are turned on, so a voltage supplied from the power-supply unit 100 is output to the next stage.

A gate of the nMOS transistor 212a of the second transistor set 212 is connected to the output terminal of the inverting circuit 213. Further, the external input signal, denoted as Selection, is applied to a gate of the pMOS transistor 212b of the second transistor set 212. Accordingly, if a high-level pulse signal is applied as the external input signal, the nMOS and pMOS transistors 212a and 212b of the second transistor set 212 are turned off. However, if a low-level pulse signal is applied as the external input signal, the nMOS and pMOS transistors 212a and 212b of the second transistor set 212 are turned on. Thus, the ground voltage is output to the next stage.

Figure 8A:
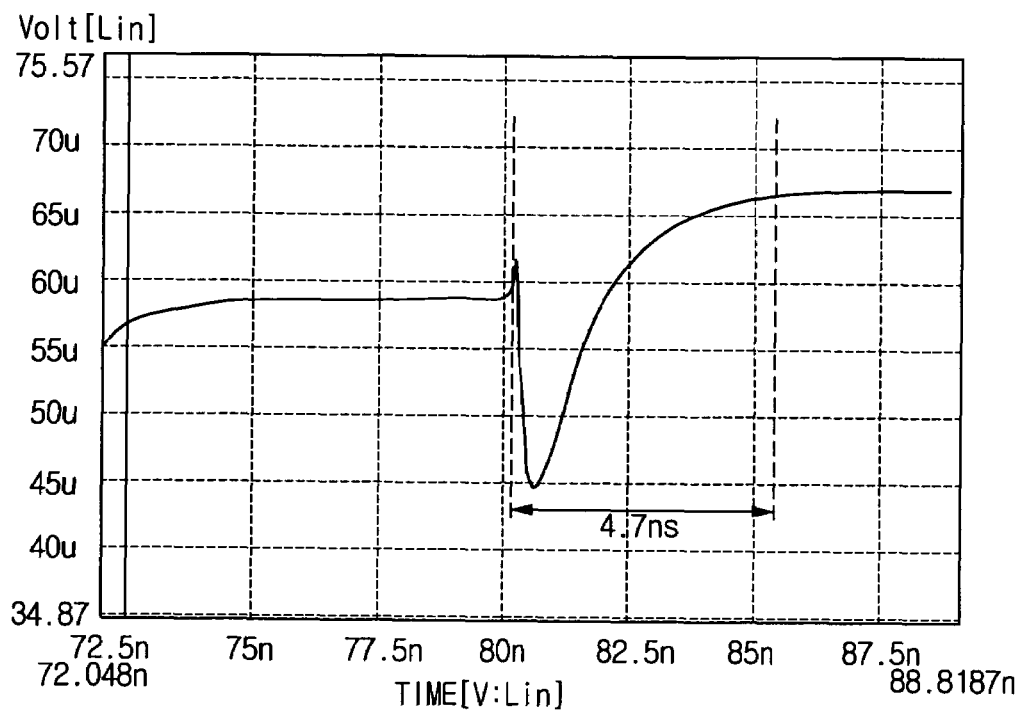
FIGS. 8A and 8B are views for describing improvements on glitches occurring in a conventional digital-to-analog converter and in an exemplary embodiment of digital-to-analog converter, respectively.
Figure 8B:
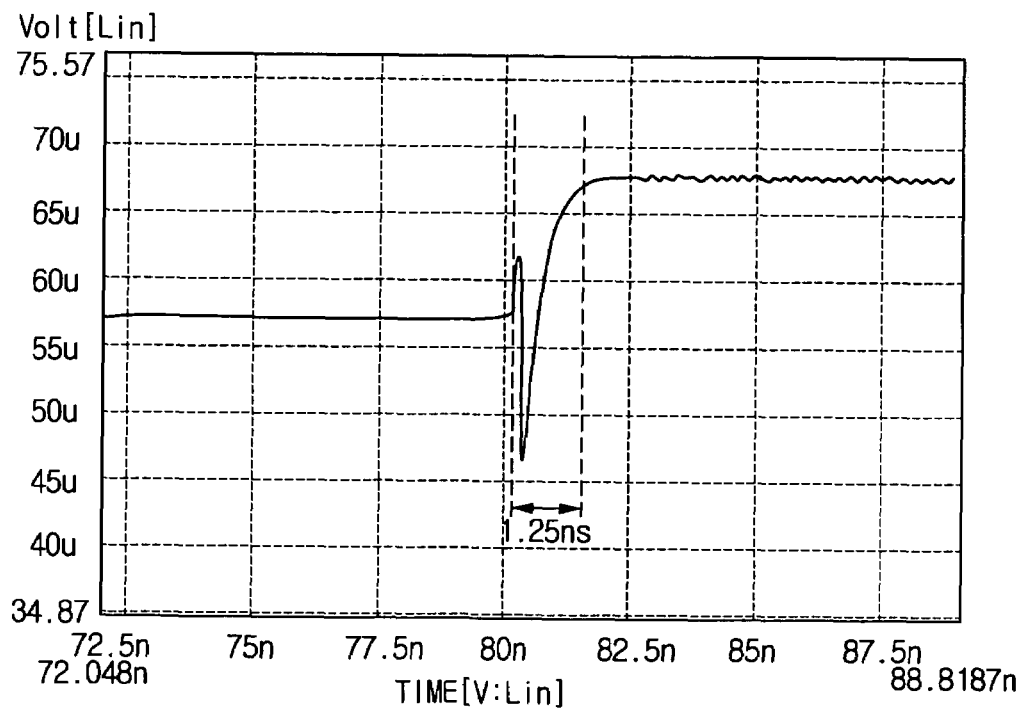

FIGS. 8A and 8B are views for showing simulation results for describing the extent that the glitch characteristics of the present digital-to-analog converter are improved, compared to the prior art. FIG. 8A shows an output of a conventional digital-to-analog converter. The conventional digital-to-analog converter outputs an analog voltage of about 57 µV till 80 ns, but drops the output voltage to 44 µV as a different digital signal is input. Thereafter, the output voltage gradually increases, and reaches 67 µV with a new digital signal input. As a result, it takes about 4.7 ns for normal converting to be performed.

FIG. 8B shows an output of the present digital-to-analog converter. At the time point of 80 ns, the present digital-to-analog converter drops its output voltage with a different digital signal input, and then rapidly increases again. As a result, it takes about 1.25 ns for the normal converting to be performed. That is, the present digital-to-analog converter has improved glitch characteristics since the time period for which error values occur becomes shorter than the prior art.

As stated above, the present invention can construct a digital-to-analog converter with plural transistors having the same operating characteristics. Therefore, the present invention can reduce the time it takes for switching delays caused by switching of currents output from the transistors, so as to reduce the time period for converting. Thus, the present invention improves the glitch characteristics.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A digital-to-analog converter comprising:
    a power-supply unit which outputs voltages of different magnitudes through a plurality of output terminals thereof;
    a plurality of switches, which are connected to the plurality of output terminals, are controlled into an on state or into an off state, and apply the output voltages of the power-supply unit or a ground voltage to a next stage; and
    a plurality of source transistors which are connected to the plurality of switches, wherein output currents of magnitudes corresponding to the voltages applied through the connected switches, and wherein output voltages of the plurality of switches are applied to gate electrodes of the source transistors.

2. The digital-to-analog converter as claimed in claim 1, wherein the plurality of source transistors have equivalent operating characteristics.

3. The digital-to-analog converter as claimed in claim 2, wherein the plurality of source transistors have a same electron mobility in an MOS-channel, a same capacitance per unit area of a gate electrode, a same width of the gate electrode, a same length of the gate electrode, and a same threshold voltage.

4. The digital-to-analog converter as claimed in claim 2, wherein the plurality of source transistors output current of a magnitude of 2n, respectively, wherein n equals a power to which 2 is raised at respective binary place values in a binary number.

5. The digital-to-analog converter as claimed in claim 4, wherein the power-supply unit comprises:
    a current source which outputs a reference current of a certain magnitude;
    a plurality of current-mirror circuits which are arranged in order from the current source, and convert, as an output, the reference current into current of a magnitude proportional to the arrangement order from the current source; and a plurality of transistors which are connected to the plurality of current-mirror circuits and output voltages of magnitudes corresponding to currents output from the connected current-mirror circuits.

6. The digital-to-analog converter as claimed in claim 5, wherein the plurality of current-mirror circuits convert mirrored reference current to current as expressed in an equation below:

$$I=2n-1*\alpha*Iref,$$

wherein, Iref denotes the reference current, n denotes a natural number corresponding to a place value in a binary number, and α denotes a constant.

7. The digital-to-analog converter as claimed in claim 6, wherein the plurality of source transistors are metal oxide semiconductor (MOS) transistors.

8. The digital-to-analog converter as claimed in claim 4, further comprising an output unit which output current of a magnitude corresponding to a sum of currents output from the plurality of source transistors.

9. The digital-to-analog converter as claimed in claim 8, wherein the output unit outputs current expressed in an equation as below:

$$Io=\alpha*Iref*(b0*20+b1*21+b2*22+b3*23+\ldots+bn-1*2n-1),$$

wherein, Io denotes analog output current corresponding to an input digital signal, Iref denotes the reference current, b0 to bn−1 denote input digital binary code, and n is a natural number.

10. The digital-to-analog converter as claimed in claim 9, wherein an external input signal controls the plurality of switches with either a low-level pulse or a high-level pulse corresponding to an input digital signal of 0 or 1, respectively.

11. The digital-to-analog converter as claimed in claim 10, wherein each of the plurality of switches comprises:

a first transistor set including a first nMOS transistor and a first pMOS transistor connected to face each other, and, if the first nMOS and pMOS transistors are turned on, passing an output voltage of the power-supply unit to the next stage; and a second transistor including a second nMOS transistor and a second pMOS transistor connected to face each other, and, if the second nMOS and pMOS transistors are turned on, passing a ground voltage to the next stage.

12. The digital-to-analog converter as claimed in claim 1, wherein if the switches are controlled into an on state, the output voltages are applied to the next stage, and if the switches are controlled into an off state, the ground voltage is applied to the next stage.

13. The digital-to-analog converter as claimed in claim 1, wherein the next stage corresponds to the plurality of source transistors, and each source transistor of the plurality of source transistors is connected to a corresponding switch of the plurality of switches.

14. A digital-to-analog conversion method comprising:

supplying voltages of different magnitudes through a plurality of output terminals;

connecting a plurality of switches to the plurality of output terminals;

controlling the switches by an external input signal, wherein the switches are controlled into an on state or into an off state;

applying the output voltages or a ground voltage to a next stage; and a connecting a plurality of source transistors to the plurality of switches, wherein the plurality of source transistors output currents of magnitudes corresponding to the voltages applied through the connected switches, and wherein output voltages from the plurality of switches are applied to gate electrodes of the MOS transistors.

15. The digital-to-analog conversion method as claimed in claim 14, wherein, the plurality of source transistors are MOS transistors.

16. The digital-to-analog conversion method as claimed in claim 14, further comprising outputting current of a magnitude corresponding to a sum of currents output from the plurality of source transistors.

17. A digital-to-analog conversion method as claimed in claim 14, wherein the external input signal controlling the switches use, a low-level pulse or a high-level pulse corresponding to an input digital signal of 0 or 1, respectively.

18. The digital-to-analog conversion method as claimed in claim 14, wherein if the switches are controlled into an on state, the output voltages are applied to the next stage, and if the switches are controlled into an off state, the ground voltage is applied to the next stage.

19. The digital-to-analog conversion method as claimed in claim 14, wherein the next stage corresponds to the plurality of source transistors, and each source transistor of the plurality of source transistors is connected to a corresponding switch of the plurality of switches.

* * * * *